(12) United States Patent
Kim et al.

(10) Patent No.: US 6,910,636 B2
(45) Date of Patent: Jun. 28, 2005

(54) IC CARD AND MANUFACTURING METHOD THEREOF

(75) Inventors: Deok-heung Kim, Yongin-si (KR); Chang-gyoo Kim, Yongin-si (KR); Seung-seob Lee, Yongin-si (KR)

(73) Assignee: Samsung Techwin Co., Ltd. (KR)

( * ) Notice: Subject to any disclaimer, the term of this patent is extended or adjusted under 35 U.S.C. 154(b) by 0 days.

(21) Appl. No.: 10/459,352

(22) Filed: Jun. 11, 2003

(65) Prior Publication Data

US 2003/0226901 A1 Dec. 11, 2003

(30) Foreign Application Priority Data

Jun. 11, 2002 (KR) .................................. 10-2002-0032517

(51) Int. Cl.⁷ .............................................. G06K 19/06
(52) U.S. Cl. ...................................... 235/492; 235/487
(58) Field of Search .................................. 235/492, 487, 235/488, 380; 361/737; 29/600; 343/732, 741, 748

(56) References Cited

U.S. PATENT DOCUMENTS

| | | | | |
|---|---|---|---|---|
| 4,822,988 A | * | 4/1989 | Gloton ....................... 235/492 |
| 5,612,532 A | * | 3/1997 | Iwasaki ....................... 235/492 |
| 5,671,525 A | * | 9/1997 | Fidalgo ....................... 29/600 |
| 5,903,239 A | * | 5/1999 | Takahashi et al. ... 343/700 MS |
| 6,412,702 B1 | | 7/2002 | Ishikawa et al. ............ 235/492 |
| 6,556,175 B2 | | 4/2003 | Okamura et al. ........... 343/895 |
| 6,568,600 B1 | * | 5/2003 | Carpier et al. .............. 235/492 |

* cited by examiner

*Primary Examiner*—Diane I. Lee
*Assistant Examiner*—Kumiko C. Koyama
(74) *Attorney, Agent, or Firm*—St. Onge Steward Johnston & Reens LLC

(57) ABSTRACT

An IC card includes an antenna circuit pattern formed on an insulation film and having a wire-shaped antenna portion, a portion corresponding to a chip bump of a combi-chip, and an attachment portion to which an external contact pad is attached. The combi-chip is attached to a portion corresponding to the chip bump of the combi-chip module on the antenna circuit pattern. At least one dielectric layer is attached to the antenna circuit pattern. An external contact pad is inserted in a hole formed in part of the dielectric layer and attached to the hole and has terminals formed in an outer surface and an inner surface of a substrate and connected to one another. The terminals on the inner surface contact the attachment portion is provided on the antenna circuit pattern.

9 Claims, 9 Drawing Sheets

IC CARD AND MANUFACTURING METHOD THEREOF

CROSS-REFERENCES TO RELATED APPLICATIONS

This application claims priority from Korean Patent Application No. 2002-32517, filed on Jun. 11, 2002, in the Korean Intellectual Property Office, the disclosure of which is incorporated herein in its entirety by reference.

BACKGROUND OF THE INVENTION

1. Field of the Invention

The present invention relates to an IC card and a method of manufacturing the same, and more particularly, to an IC card in which an antenna circuit pattern and a contact circuit board of a combi-chip provided in the IC card are directly connected so that an electric resistance therebetween is reduced, and a method of manufacturing the same.

2. Description of the Related Art

IC cards refer generally to cards on which IC chips are mounted and can be used as electronic identification (ID) cards, license cards, electronic money, and credit cards with various information stored in the IC chips. The term "IC card" used herein is intended to include "Smart card", "Chip card", and "Memory card", etc. as typically used in commerce. For example, by providing personal information such as address, name, citizenship registration number (or ID number), driver's license number, and medical insurance number in an IC chip, the IC card can be used as an electronic ID card. In another example, the IC card can be used as electronic money with bank deposit information stored in a chip so that, for example, purchase payments at stores are possible without using cash, rather by accessing the bank deposit information of a user and deducting purchase prices from the bank deposit account. In yet another example, a certain amount of money is charged as electronic money and a subway fare or electric railway fair is deducted from the electronic money amount.

The IC card can typically be classified into a contact type and a non-contact type based upon the method of communication between the IC card and a terminal. A contact type IC card performs a predetermined operation as a contact terminal formed on the IC card contacts a contact terminal of the external terminal. However, in a non contact type IC card, communications between the IC card and an external terminal is carried out using a radio frequency (RF). The non-contact type IC card uses an RF of a high frequency or lower frequency for the communications.

On the other hand, a combi-type IC card (or Combi Card) typically has a low frequency RF chip module and a combi-chip module. The combi-chip module can perform communications in a contact type method or using a high frequency RF. Thus, the combi-type IC card can perform communications in the contact type method and using a low or high RF.

FIG. 1 is a sectional view illustrating a typical combi-type IC card. Referring to the drawing, a combi-type IC card includes a low frequency chip module 21 and a combi-chip module 16. The low frequency chip module 21 is arranged adjacent to the center of the card while the combi-chip module 16 is arranged adjacent to a lateral side of the card. The low frequency chip module 21 and the combi-chip module 16 are respectively embedded in the first and second dielectric layers 11 and 12 attached to each other. Upper and lower protective layers 13 and 14 are provided on an upper surface of the first dielectric layer 11 and a lower surface of the second dielectric layer, respectively. A cover layer 15 is disposed beneath the lower protective layer 14. Also, a hologram 23 can be attached on one side of the surface of the upper protective layer 13.

A low frequency antenna pattern 24 of the low frequency chip module 21 is arranged on a film 21a supporting the low frequency chip module 21 and is embedded between the first and second dielectric layers 11 and 12. The low frequency chip module 21 is arranged preferably at a central portion of the card. Thus, the low frequency antenna pattern 24 is disposed in a loop form around the central portion of the card.

A high frequency antenna pattern 18 provided at the combi-chip module 16 is formed before the combi-chip module 16 is inserted within a hole in the first and second dielectric layers 11 and 12. When the combi-chip module 16 is inserted in a hole 27 (FIG. 2D) formed in the first and second dielectric layers 11 and 12 by a milling process, the high frequency antenna pattern 18 is electrically connected to an antenna connect pad (not shown) of the combi-chip module 16 via a conductive paste (not shown). The high frequency antenna pattern 18 is disposed about the peripheral portion of the card.

FIGS. 2A through 2E are sectional views illustrating steps of manufacturing the IC card shown in FIG. 1. Referring to FIG. 2A, the first and second dielectric layers 11 and 12, the low frequency chip module 21 to be embedded between the first and second dielectric layers 11 and 12, and the upper and lower protective layers 13 and 14 are provided. A hole 11a in which the low frequency chip module 21 is to be inserted is formed in advance in the first dielectric layer 11. The low frequency chip module 21 is provided in a module in which the low frequency antenna 24 is disposed on a support film 25.

Also, it can be seen that the high frequency antenna 18 is disposed between the upper protective film 13 and the first dielectric layer 11 before the combi-chip module is provided thereto.

Referring to FIG. 2B, all elements shown in FIG. 2A are assembled. As a chip of the low frequency chip module 21 is inserted in the hole 11a of the first dielectric layer 11, the low frequency chip module 21 is embedded between the first and second dielectric layers 11 and 12. Also, the low frequency antenna 24 is embedded between the first and second dielectric layers 11 and 12. The high frequency antenna 18 is embedded between the first dielectric layer 11 and the upper protective layer 13.

Referring to FIG. 2C, a hologram 23 is attached to one side of an upper surface of the upper protective film 13.

Referring to FIG. 2D, a hole 27 in which the combi-chip module is to be inserted is formed. The hole 27 is formed, for example, by milling relevant portions of the upper protective layer 13, the first dielectric layer 11, and the second dielectric layer 12. Part of the high frequency antenna 18 is exposed by removing the area of the hole 27 in the upper protective layer 13 greater than that of the hole 27 in the first and second dielectric layers 11 and 12.

Referring to FIG. 2E, a conductive paste 28 is coated on an exposed portion of the high frequency antenna 18.

FIG. 2F illustrates the combi-chip module 16.

Referring to FIG. 2G, the combi-chip module 16 shown in FIG. 2F is assembled by inserting in the hole 27. The combi-chip module 16 itself is attached to the card through an adhesive portion 29. An antenna contact pad (not shown)

provided in the combi-chip module 16 is electrically connected to the high frequency antenna 18 via the conductive pad 28.

In the above IC card, since the high frequency antenna 18 and the antenna contact pad of the combi-chip module 16 are electrically connected using the conductive paste, the electrical resistance of the conductive paste increases. That is, since the conductive paste includes a conductive component and a binder, the resistance thereof increases due to a low density of the conductive component. The resistance is further increased as the volume of the conductive component is reduced by reaction of a high molecular substance of the binder. Also, since the pad is oxidized by a solvent component, the resistance of the pad is further increased. As a result, the length of recognizing a high frequency signal is shortened. The conductive paste is a mixture of a plastic component exhibiting a high degree of hardness and conductive particles exhibiting no adhesiveness, and thus, the conductive paste is weak at mechanical deformation such as bending and cracks or a short circuit is easily generated. Furthermore, since the chip module and the external contact pad are disposed in a card having a limited thickness, it is difficult to manufacture the contact pad and the chip module having a desired strength and durability. Also, additional processes for manufacturing the chip module and assembling the same are needed.

SUMMARY OF THE INVENTION

To solve the above and other problems, the present invention provides an IC card in which an electric resistance is minimized by directly connecting the antenna and the combi-chip.

Also, the present invention provides a method of manufacturing an IC card in which the antenna and the combi-chip is directly connected.

According to an aspect of the present invention, an IC card comprises an antenna circuit pattern disposed on an insulation film and having a wire-shaped antenna portion, a connection portion, and an attachment portion; a combi-chip including a chip bump and mounted to the connection portion of the antenna circuit pattern; at least one dielectric layer including a through hole and attached to the antenna circuit pattern; and an external contact pad inserted in the through hole of the dielectric layer, the external contact pad having terminals formed in an upper surface and an lower surface of a substrate which are electrically connected to one another, the terminals on the lower surface being electrically connected to the attachment portion of the antenna circuit pattern.

The combi-chip and the external contact pad are mounted to different surfaces of the antenna circuit pattern.

The antenna portion of the antenna circuit pattern is extended in a loop form along the outer circumferential portion of the IC card.

The IC card further comprises a bridge mounted on a rear surface of the film to electrically connect the combi-chip to an external end portion of the wire-shaped antenna portion for a high frequency use formed on the antenna circuit pattern in a loop form.

The combi-chip and the external contact pad are attached to the antenna circuit pattern via an attachment paste.

The external contact pad is provided in such a way that contact terminals formed on the upper and lower surfaces of the substrate connect to each other through a plating layer formed at inner surfaces of holes formed through the substrate.

According to anther aspect of the present invention, a method of manufacturing an IC card, comprises the steps of forming an antenna circuit pattern on an insulation film where an wire-shaped antenna portion, a connection portion corresponding to a chip bump of a combi-chip, and an attachment portion to which an external contact pad is to be mounted are formed, mounting the combi-chip to the connection portion corresponding to the chip bump of the combi-chip on the antenna circuit pattern, disposing a dielectric layer onto the antenna circuit pattern, forming a hole in the dielectric layer corresponding to the attachment portion on the antenna circuit pattern, and inserting the external contact pad in the hole formed in the dielectric layer so as to be mounted to the attachment portion.

BRIEF DESCRIPTION OF THE DRAWINGS

The above features of the present invention will become more apparent by describing in detail preferred embodiments thereof with reference to the attached drawings in which.

DETAILED DESCRIPTION OF THE INVENTION

Figure 3A:
FIGS. 3A through 3L are sectional views illustrating steps of manufacturing an IC card according to a preferred embodiment of the present invention.

Referring to FIG. 3A, a clad layer 31 made of copper is formed on a film 32. The clad layer 31 is provided as a conductive layer to form a high frequency antenna pattern and a pattern for connection of a contact terminal (not shown).

Figure 3B:
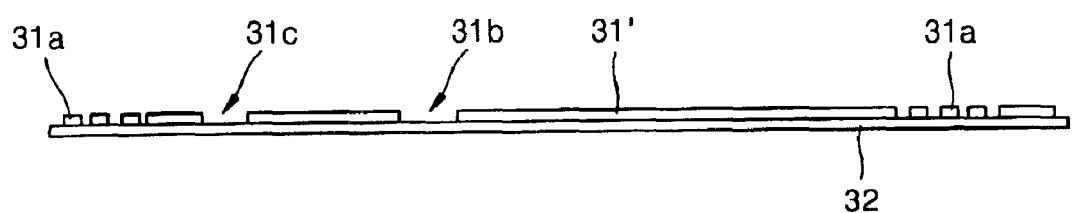

Referring to FIG. 3B, the clad layer 31 is disposed on the film 32 to form a predetermined antenna circuit pattern 31'. The antenna circuit pattern 31' can be formed in a typical method. For example, photoresist is coated on the clad layer 31 and then covered with a photomask. Thereafter, the photoresist is exposed and developed, and the clad layer 31 is etched. Then, an antenna pattern is formed by removing the photoresist. The antenna circuit pattern 31' includes a wire shaped antenna portion 31a formed into a loop form, a connection portion 31b configured to mount a combi-chip having a chip bump (35a in FIG. 3F), and an attachment portion 31c to which an external contact pad 45 of FIG. 3K is mounted.

The wire-shaped antenna portion 31a has a planar shape similar to that known in the art in which an antenna wire is extended in a loop form about an outer circumferential portion of a card. That is, as the conventional antenna wire is extended along the outer circumferential portion of the card, the wire-shaped antenna portion 31a is preferably extended such that a wire type pattern which is thin and lengthy winds several turns along the outer circumferential portion of the card.

A pad pattern (not shown) corresponding to the chip bump 35a (FIG. 3F) of the combi-chip 35 (FIG. 3F) to be mounted in a subsequent step is formed at the connection portion 31b. Also, the attachment portion 31c for attachment of an external contact pad 45 (see FIG. 3K) is formed at the other side, which is a pattern for attaching the external contact pad 45 in a subsequent step.

Figure 3C:
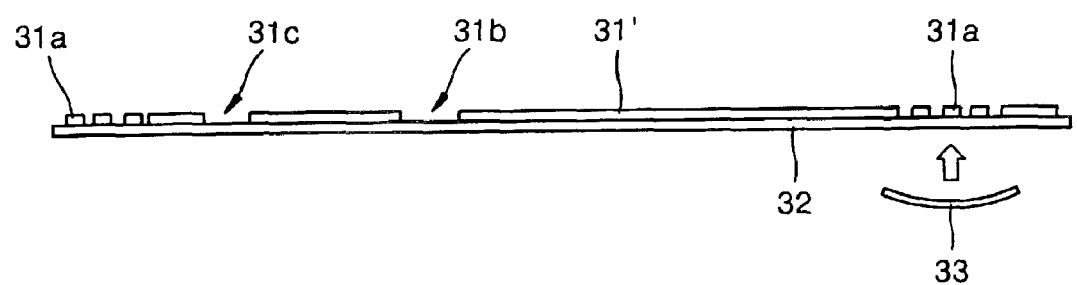
Figure 3D:
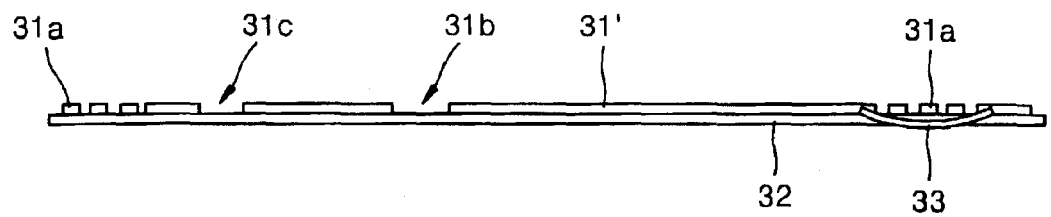

Referring to FIGS. 3C and 3D, a bridge 33 is mounted at one side of a lower surface of the film 32. The bridge 33 connects one end portion of the wire-shaped antenna portion 31a formed in a loop form to another portion to form a closed circuit. That is, the bridge 33 electrically connects an end portion of the wire type antenna pattern disposed at the outermost portion of the wire-shaped antenna portion 31a and the combi-chip 35 disposed at the central portion of the card.

Figure 5:
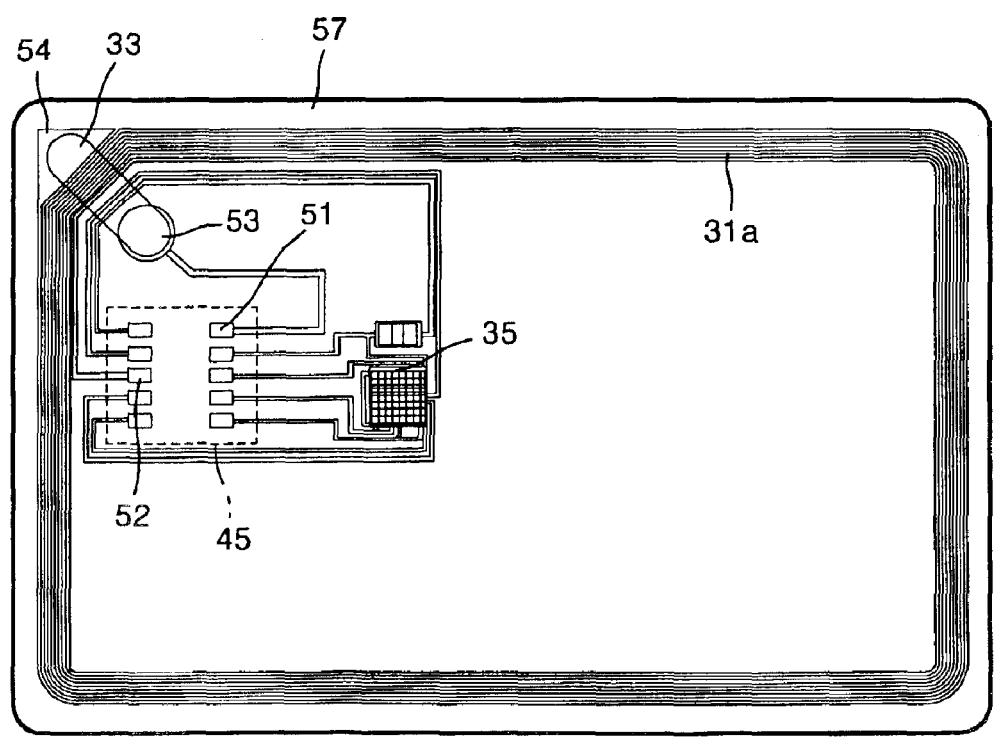
FIG. 5 is a plan view illustrating an antenna portion of the antenna circuit pattern according to the present invention.

FIG. 5 schematically shows how the antenna portion 31a and the bridge 33 are formed. In FIG. 5, the pattern is not an actual pattern so that the connection portion 31b corresponding to the chip bump of the combi-chip 35 and the attachment portion 31c for attachment of the external contact pad 45 are not shown.

Referring still to FIG. 5, the wire-shaped antenna portion 31a is extended along the outer circumference on a surface 57 of the card in a loop pattern. Two ports 51 and 52 to be connected to the combi-chip 35 are formed at one side of the wire-shaped antenna portion 31a. There are two other ports 53 and 54 which are connected by the bridge 33 and form a connected antenna. Since the ports 53 and 54 are connected by the bridge 33 at the lower surface of the film 32 where a clad is not formed, as shown in FIG. 3C, a loop antenna is formed. In another embodiment not shown in the Figure, the bridge 33 can be arranged on the wire shaped antenna portion 31a on the upper surface of the film 32 where a clad is formed. In this case, insulating paste or an insulating sheet is applied to the upper surface of the antenna portion located between two ports to be connected, and then the bridge made of conducting paste or a conducting sheet is attached between the ports.

Figure 3E:
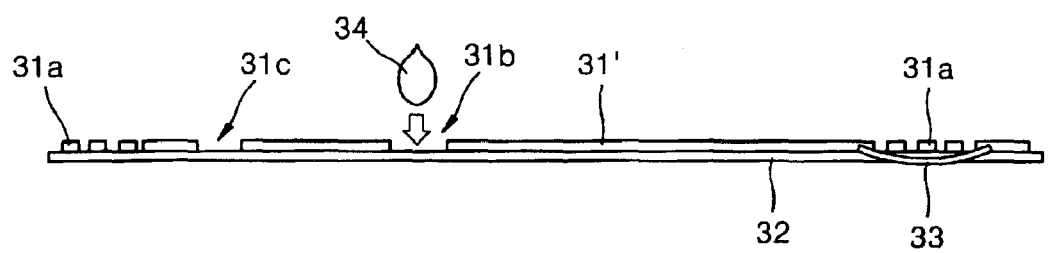

Referring to FIG. 3E, a paste 34 for attachment is provided to install the combi-chip 35. The paste 34 for attachment may be conductive or non conductive. However, a non-conductive paste is preferable to minimize the electric resistance.

Figure 3F:
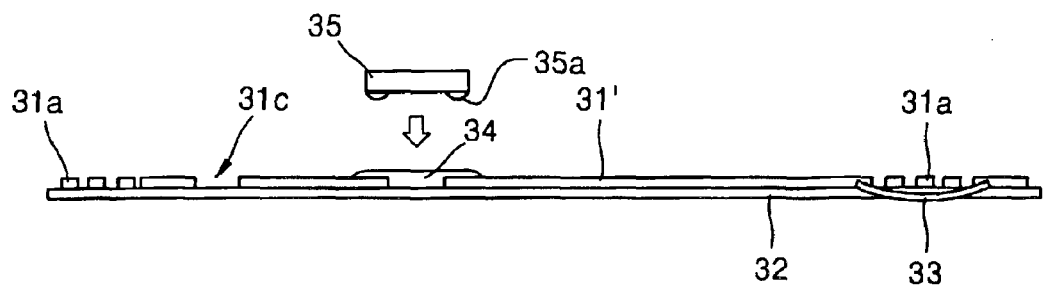
Figure 3G:
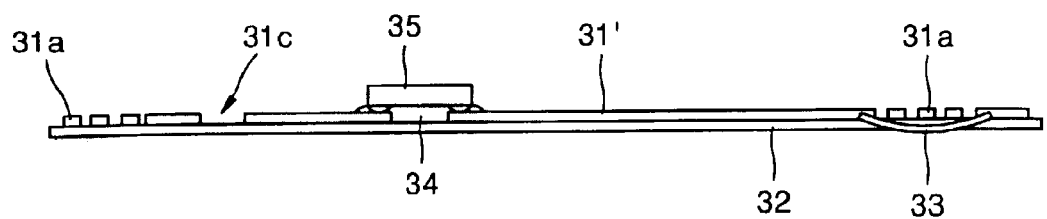

Referring to FIGS. 3F and 3G, the combi-chip 35 is installed on the antenna circuit pattern 31'. The chip bump 35a of the combi-chip 35 is installed at the connection portion 31b on the antenna circuit pattern 31' via the paste 34 for attachment.

Figure 3H:
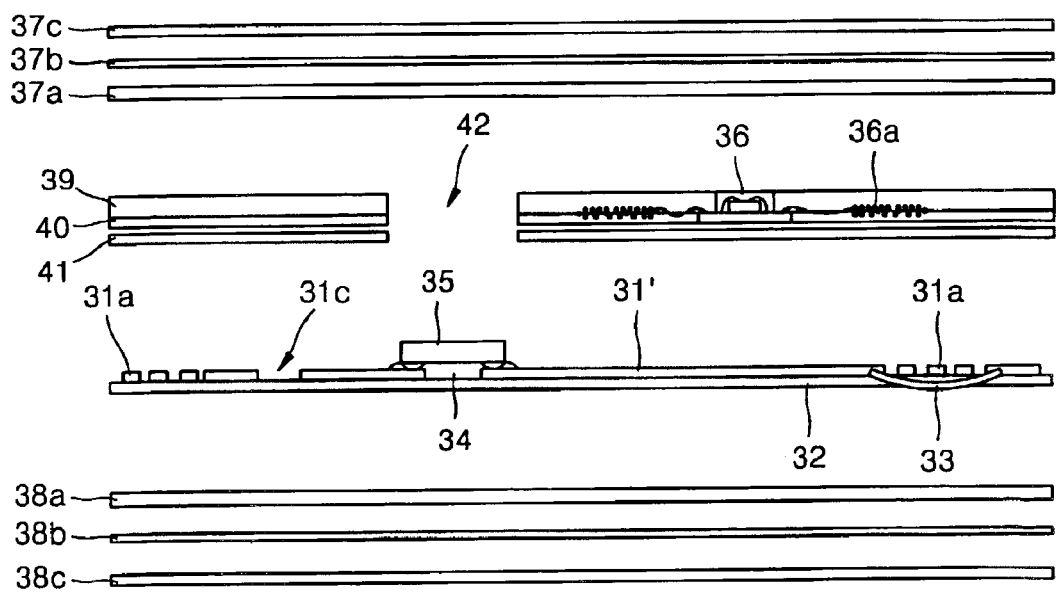

Referring to FIG. 3H, a main body of the card including a first dielectric layer 39 where a low frequency chip module 36 is embedded in another step, a second dielectric layer 40, and a protective layer 41 formed on a lower surface of the second dielectric layer 40 is arranged to be attached on the antenna circuit pattern 31'. A through hole 42 in which the combi-chip 35 is to be inserted is formed in the first and second dielectric layers 39 and 40 and the protective layer 41. Also, an attachment layer 37a, a print layer 37b, and a cover layer 37c are deposited in order on the upper surface of the main body of the card. Also, an attachment layer 38a, a print layer 38b, and a cover layer 38c are deposited in order under the lower surface of the main body of the card.

Alternatively, when the antenna circuit pattern 31', to which the combi-chip 35 is attached, is attached to the dielectric layers, the combi-chip 35 can be attached to face downward by turning the film 32 upside down. In this case, instead of forming the hole in the first and second dielectric layers 39 and 40 and the protective layer 41, a hole should be formed in the attachment layer 38a, a print layer 38b, and a cover layer 38c. With such arrangement, the combi-chip 35 and the external contact pad to be attached in a subsequent process, are disposed at the opposite sides of the antenna circuit pattern 31', of which structure is not similar to that shown in FIG. 3K. Then, the combi-chip 35 is further separated from the external contact pad 45 contacting the outside so that a structure stable to the external influence is available. Also, the external contact pad 45 can be produced in a thin film form. Also, since the thickness of the dielectric layers where the external contact pad is inserted can be varied, the hole can be easily formed by milling or in some cases, manufactured in advance by punching or etching the dielectric layers. Here, the lower frequency chip module 36 can be selectively provided.

Figure 3I:
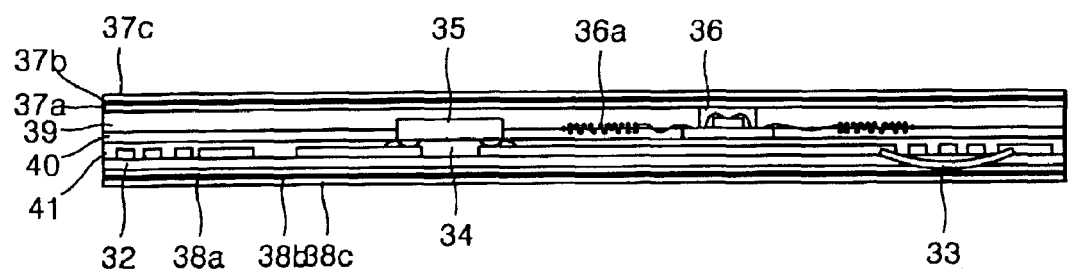

FIG. 3I shows a state in which all parts shown in FIG. 3H are assembled.

Figure 3J:
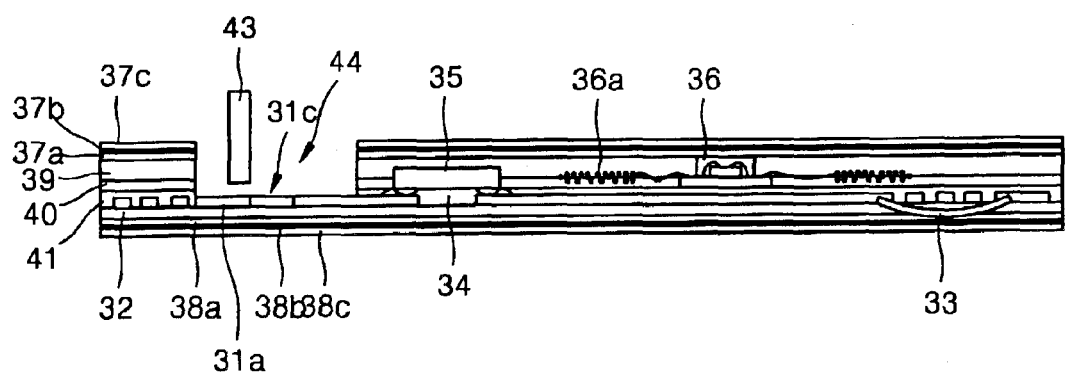
Figure 3K:
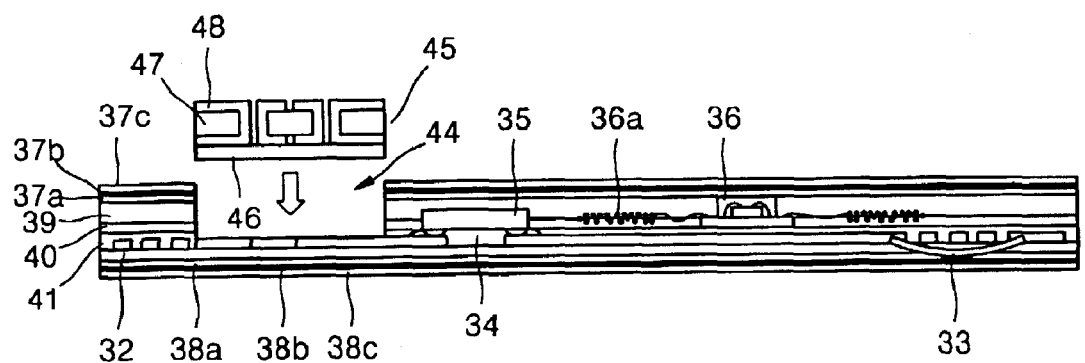

Referring to FIG. 3J, a hole 44 is formed using a milling machine 43. The hole 44 is formed corresponding to a wire-shaped portion 31a and the attachment portion 31c for the external contact pad 45.

Referring to FIG. 3K, the external contact pad 45 is inserted in the hole 44 and attached thereto. The external contact pad 45, as shown in the drawing, is prepared in such a way that the upper and lower surfaces of a substrate 47 are disposed with a plating layer 48 to be used as contact terminals and that the plating layer 48 extends through holes formed in the substrate 47 so that the contact terminals formed in the upper and lower surfaces of the substrate 47 are electrically connected to each other.

The external contact pad 45 is directly attached to the attachment portion 31c on the antenna circuit pattern 31' via an attachment paste 46. The attachment paste 46 may be a conductive paste or a non-conductive paste. Where the attachment paste 46 is a non-conductive paste, the contact terminals formed on the lower surface of the contact pad 45 directly contact the wire-shaped antenna portion 31a and contact terminal pattern 31'.

In the other embodiment not shown in the drawings, the external contact pad 45 may be attached to the antenna circuit pattern 31' on the other surface of the antenna circuit pattern 31', which surface does not include the combi-chip 35. For example, the combi-chip 35 is attached to the upper surface of the antenna circuit pattern 31', while the external contact pad 46 is attached to the lower surface of the antenna pattern 31'. In order to have the external contact pad 46 attached to the-other surface of the antenna pattern 32' than the combi-chip 35, a hole through the film 32 is formed at a location corresponding to that of the portion 31c by means of an appropriate tool, such as a mill, so that contact pads of the external contact pad 45 may be contacted to the antenna circuit pattern 31'.

Figure 3L:
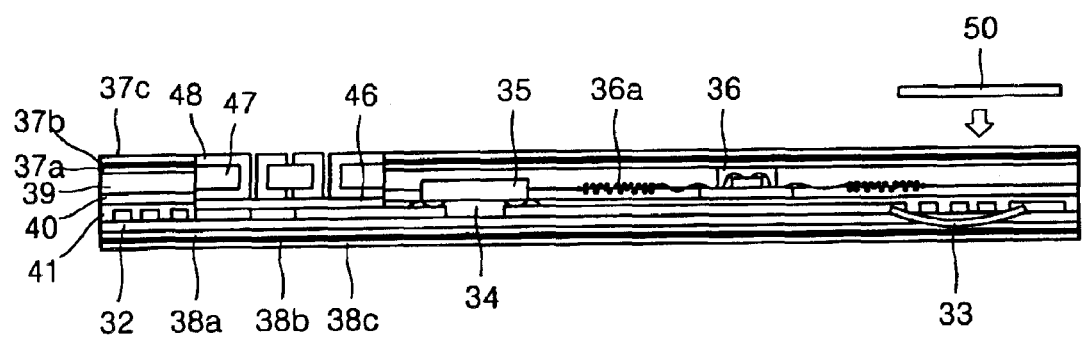

FIG. 3L shows a state in which a hologram 50 is attached to one side of the upper surface of an IC card. The hologram 50 is attached to prevent copying of the IC card or to identify whether the IC card has been copied or not. Other identification mark can be attached instead of the hologram 50.

Figure 1:
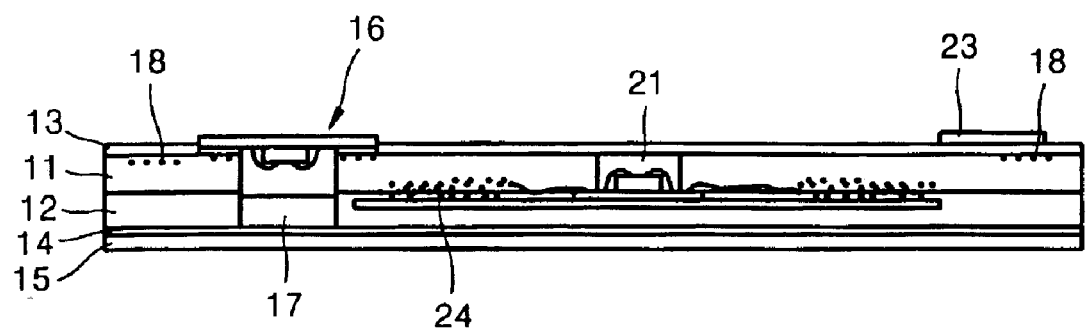
FIG. 1 is a sectional view illustrating a typical IC card.
Figure 2A:
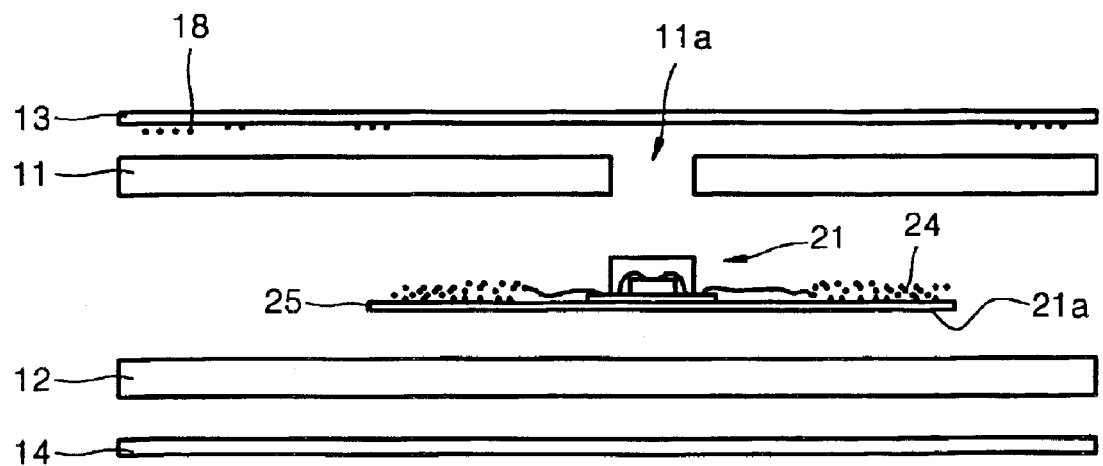
FIGS. 2A through 2G are sectional views illustrating steps of manufacturing the IC card shown in FIG. 1.
Figure 2B:
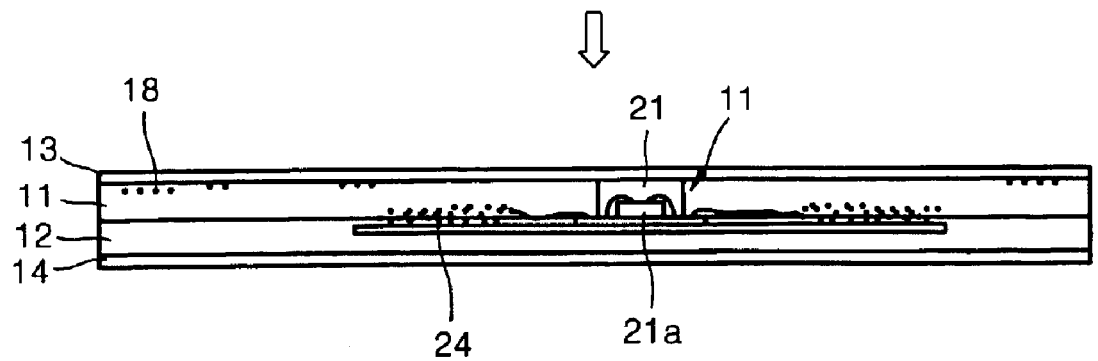
Figure 2C:
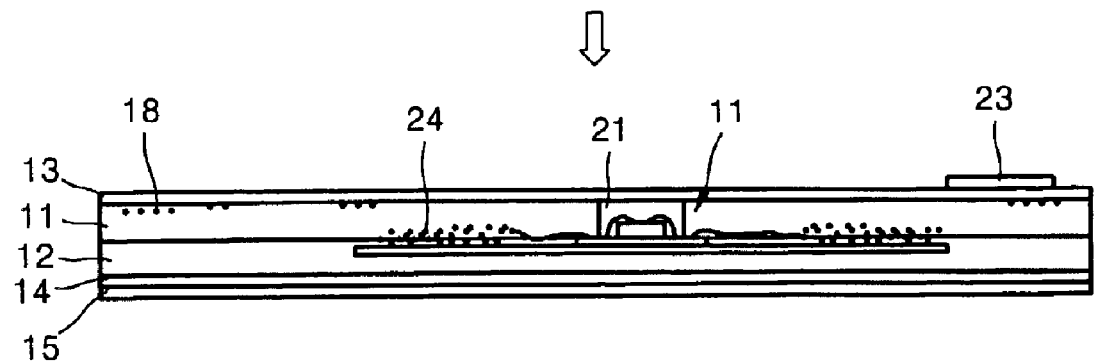
Figure 2D:
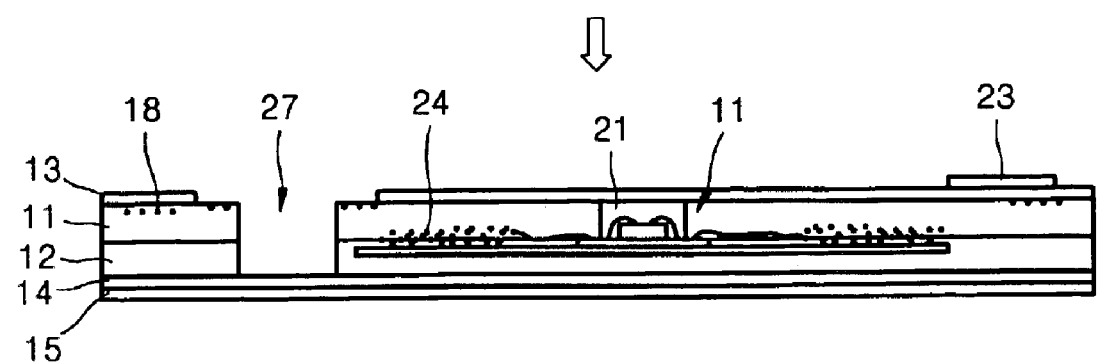
Figure 2E:
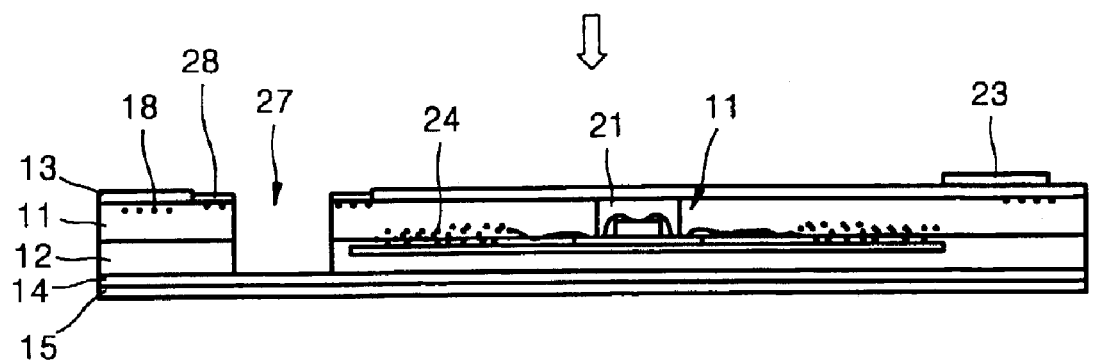
Figure 2F:
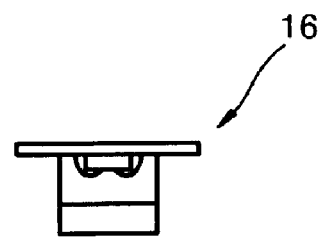
Figure 2G:
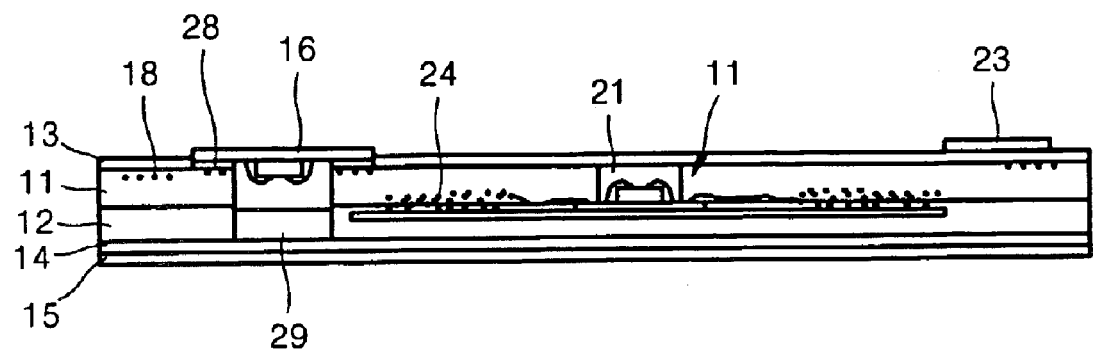
Figure 4:
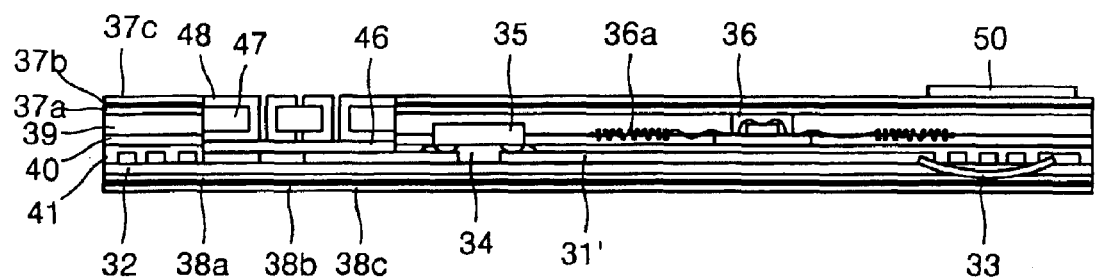
FIG. 4 is a sectional view illustrating the IC card according to the present invention.

FIG. 4 is a sectional view of a completed IC card according to the present invention. Referring to the drawing, the low frequency chip module 36 and the combi-chip 35 are embedded in the IC card. The low frequency antenna 36a of the low frequency chip module 36 is formed as a wire and embedded between the dielectric layers 39 and 40. That is, as shown in FIG. 2A illustrating a manufacturing step of an IC chip according to the conventional technology, the low frequency antenna 36 formed as a wire is embedded in the dielectric layers.

The combi-chip module 35 operates by using direct contact between the card port and the port of a terminal and also by communication with high frequency RF as described above. A high frequency antenna to receive high frequency RF is formed as the wire-shaped antenna portion 31a on the antenna circuit pattern 31'. The wire-shaped antenna portion 31a is connected to the combi-chip 35 via the pattern on the antenna circuit pattern 31'. Also, a signal from the port of an external terminal (not shown) is received through the external contact terminal 43 and transferred to the combi-chip 35 via the antenna circuit pattern 31'.

In the IC card according to the present invention, since the high frequency antenna is made in a pattern using a copper material and directly connected to the combi-chip module, electrical resistance can be reduced. Thus, a range of recognizing a high frequency signal can be maximized. Also, since not only the low frequency chip module but also the combi-chip module can be included in the card, stability of the card can be improved. Furthermore, it is advantageous that the pattern for electric connection with the external contact pad can be simultaneously formed on the pattern for forming the high frequency antenna.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An integrated circuit (IC) card comprising:

a conductive circuit pattern disposed on an insulation film, the conductive circuit pattern including a loop antenna portion, a connection portion, and an attachment portion, the connection portion and the attachment portion being laterally displaced from each other on the insulation film;

a semiconductor chip including a chip bump, the semiconductor chip mounted on the connection portion of the conductive circuit pattern through the chip bump and thereby enabling an electrical connection between the semiconductor chip and the connection portion of the conductive circuit pattern;

at least one dielectric layer including a through hole at a location corresponding to the attachment portion of the conductive circuit pattern, the dielectric layer attached to the conductive circuit pattern; and an external contact pad received in the through hole of the dielectric layer, the external contact pad having terminals formed in an upper surface and an lower surface of a substrate, the terminals of the upper surface being electrically connected to the corresponding terminals of the lower surface, the terminals on the lower surface being electrically connected to the attachment portion of the conductive circuit pattern, and thereby enabling an electrical connection between the semiconductor chip, the terminals of the external contact pad, and the loop antenna portion of the conductive circuit pattern.

2. The IC card as claimed in claim 1, wherein said semiconductor chip and said external contact pad are mounted onto the conductive circuit pattern at locations displaced from each other in a lengthwise direction of the IC card.

3. The IC card as claimed in claim 1, further comprising a bridge mounted on a rear surface of the film to electrically connect an end portion of the loop antenna portion of the conductive circuit pattern to the semiconductor chip.

4. The IC card as claimed in claim 1, wherein the semiconductor chip and the external contact pad are mounted onto the conductive circuit pattern on the same surface thereof via an attachment paste.

5. The IC card as claimed in claim 1, wherein the semiconductor chip and the external contact pad are mounted onto the conductive circuit pattern on the opposite surfaces thereof via an attachment paste.

6. The IC card as claimed in claim 1, wherein the external contact pad is provided in such a way that the terminals formed on the upper and lower surfaces of the substrate connect to each other through a plating layer formed at the inner surface of a hole formed through the substrate.

7. The IC card as claimed in claim 1, wherein the loop antenna portion of the conductive circuit pattern is for communication of a high frequency signal.

8. The IC card as claimed in claim 7, further comprising a low frequency chip module disposed therein.

9. The IC card as claimed in claim 8, wherein the low frequency chip module is embedded in the dielectric layer.

* * * * *